(12) United States Patent
Nam et al.

(10) Patent No.: US 7,887,636 B2
(45) Date of Patent: Feb. 15, 2011

(54) SUBSTRATE DRYER AND A DRYING METHOD

(75) Inventors: Chang-Hyeon Nam, Gyeonggi-do (KR); Seung-Kun Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1166 days.

(21) Appl. No.: 11/330,818

(22) Filed: Jan. 11, 2006

(65) Prior Publication Data
US 2006/0151006 A1      Jul. 13, 2006

(30) Foreign Application Priority Data
Jan. 12, 2005   (KR) ................ 10-2005-0003011

(51) Int. Cl.
| B08B 3/12 | (2006.01) |
| B08B 6/00 | (2006.01) |
| B08B 7/00 | (2006.01) |
| B08B 7/02 | (2006.01) |
| C25F 1/00 | (2006.01) |
| C05F 3/30 | (2006.01) |
| C05F 5/00 | (2006.01) |

(52) U.S. Cl. ................. 134/1; 134/1.3; 438/745; 438/746; 438/747; 438/748

(58) Field of Classification Search ............ None
See application file for complete search history.

(56) References Cited

U.S. PATENT DOCUMENTS

| 5,685,086 | A | * | 11/1997 | Ferrell ................ 34/61 |
| 6,128,830 | A | * | 10/2000 | Bettcher et al. ........ 34/404 |
| 6,216,364 | B1 | * | 4/2001 | Tanaka et al. ......... 34/448 |
| 6,598,312 | B2 | | 7/2003 | Kim et al. |
| 2005/0067001 | A1 | * | 3/2005 | Gast et al. .......... 134/25.1 |
| 2005/0183755 | A1 | * | 8/2005 | Fujishima .......... 134/56 R |

FOREIGN PATENT DOCUMENTS

| JP | 6-216105 | 8/1994 |
| KR | 20-0182724 | 5/2000 |
| KR | 10-2004-0069650 | 8/2004 |

OTHER PUBLICATIONS

English language abstract of Korean Publication No. 20-0182724.

* cited by examiner

*Primary Examiner*—Duy-Vu N Deo
(74) *Attorney, Agent, or Firm*—Volentine & Whitt, PLLC

(57) ABSTRACT

A substrate dryer includes, among other things, means for generating isopropyl alcohol bubbles, and a vibrator to atomize stored isopropyl alcohol. A heater may be provided to heat pumped isopropyl alcohol, as wells as a spray nozzle to spray the heated IPA to the vibrator. It is possible to increase the concentration of the isopropyl alcohol supplied for the purpose of drying the substrate. Improved substrate drying is achieved.

15 Claims, 4 Drawing Sheets

SUBSTRATE DRYER AND A DRYING METHOD

CROSS-REFERENCE TO RELATED PATENT APPLICATION

This application claims the benefit of Korean Patent Application No. 10-2005-3011, filed on Jan. 12, 2005, in the Korean Intellectual Property Office, the disclosure of which is incorporated herein in its entirety by reference

BACKGROUND OF THE INVENTION

1. Field of the Invention

The present invention relates to a substrate dryer, and more particularly, to a substrate dryer in which the concentration of isopropyl alcohol supplied for drying a substrate can be increased 2. Description of the Related Art Generally, to fabricate semiconductor devices, a lithography process, a deposition process, and an etching process are repeatedly performed on a substrate. In these processes, contaminants such as particles, metals, natural oxides, organic layers, etc. may be left on the substrate. Therefore, a cleaning process is performed on the substrate to remove these contaminants. Then a drying process is performed to remove the remaining contaminants.

Conventional drying methods include a spin drying method, an isopropyl alcohol (IPA) vapor drying method, an isopropyl alcohol Marangoni drying method, and the like.

Regarding the spin drying method, a drying apparatus is relatively simple and cheap, though it is difficult to continuously perform a cleaning process and a drying process. It is also impossible to completely dry the substrate.

Regarding the IPA vapor drying method, since a drying process is performed in IPA vapor, that is, in a clean space, less contaminants are generated. However, problems arise because a particular bath is required for the cleaning and drying processes and water spots are typically generated due to exposure of the substrate to oxygen when the substrate is transferred to a drying bath from a cleaning bath.

Regarding the IPA Marangoni drying method, the substrate is dried using a Marangoni effect by vertically drawing up the substrate from a deionized (DI) water bath, or draining the DI water bath while holding the substrate fixed, and blowing nitrogen gas and IPA at the surface of the substrate near the air/liquid interface. In the IPA Marangoni drying method, it is possible to drastically reduce the amount of IPA and to prevent water-spot occurrence due to exposure of the substrate to the air because the substrate is not transferred from a cleaning bath to a drying bath.

On the other hand, when the substrate is exposed to oxygen after cleaning, unnecessary oxides are generated on the substrate and then such oxides are left as residues, thereby generating water spots. When the substrate is exposed to nitrogen, water spots are generated, which have a size smaller than when it is exposed to oxygen. These water spots are generated when hydrophobic membranes such as poly-silicon, oxide, and nitride and hydrophilic membranes exist together in an active region of a semiconductor device have various step-difference structures.

However, in a recent semiconductor process requiring a high integration density corresponding to a process margin of 0.11 micrometers or less, in a substrate with a large aperture (for example, 300 mm), patterns include both simple structures and more complicated three-dimensional structures. As an example, with a RCAT (Recess Channel Array Transistor) process, which may be applied to improve refresh characteristics of transistors of high-integrated semiconductor devices, an active region is formed in a trench pattern, and hydrophobic and hydrophilic membranes exist together. In addition, the active region is formed to have a step-difference of about 1500 Å. In such a deep trench pattern, it is difficult to completely remove leftover water while drying the substrate.

As mentioned above, because such a pattern structure is considerably challenging to the success of a drying process, water spots may occur. Particularly, water spots occur intensively in the lower part of the substrate. Further, these water spots not only may act as a mask in a subsequent etching process, so that an etching residue may occur, but also are obstacles to an epitaxial process such as chemical vapor deposition (CVD) and epitaxial growth.

In the IPA Marangoni drying method performed in the nitrogen atmosphere, water spots are caused by the presence of valleys or holes and by water residue, which results when the substrate is directly exposed to the nitrogen atmosphere after being in DI water, and before going through IPA during the progression of the Marangoni effect.

Among dryers employing a conventional IPA Marangoni drying process, for example, ones manufactured by Korea DNS. Co. Ltd, and YieldUP International of U.S.A., the concentration of IPA is in the range of 0.15 to 0.25%. Compare this to when the concentration of IPA is in the range of about 2 to 3% and water spots do not occur during the drying process.

On the other hand, in the IPA Marangoni dryer, as disclosed in U.S. Pat. No. 6,598,312, IPA is supplied to the inside of a cleaning bath through an IPA bubbling device, and IPA bubbles are generated by supplying nitrogen to the inside of a bubble tank.

As a result, it is possible to increase the concentration of IPA to some level by increasing the amount of nitrogen to be supplied, or by raising the pressure of nitrogen to be supplied. However, there is a problem that if the amount of nitrogen is increased over the reference level of a particular process, then the mixture ratio of nitrogen and IPA is not within a regulated level, so that unexpected water spots can be generated due to the excessive amount and pressure of nitrogen.

SUMMARY OF THE INVENTION

The present invention is contrived to solve the above-mentioned problems. In an embodiment of the present invention a substrate dryer in which the concentration of isopropyl alcohol (IPA) can be increased while the amount and the pressure of nitrogen supplied for the purpose of generating IPA bubbles are kept constant in the IPA Marangoni drying process.

Another embodiment of the present invention provides a substrate dryer which can generate and supply IPA that is atomized using ultrasonic waves along with IPA bubbles generated using nitrogen to increase the concentration of IPA in the IPA Marangoni drying process.

Still another embodiment of the present invention provides a substrate dryer using megasonic or ultrasonic waves and heat along with bubbles generated using nitrogen to increase the concentration of IPA.

Yet another embodiment of the present invention provides a method of drying a substrate by using megasonic or ultrasonic waves and heat to increase the concentration of IPA while the amount and the pressure of nitrogen supplied for generating IPA bubbles are kept constant in the IPA Marangoni drying process.

BRIEF DESCRIPTION OF THE DRAWINGS

The above and other features and advantages of the present invention will become more apparent by describing in detail exemplary embodiments with reference to the attached drawings in which.

DESCRIPTION OF PREFERRED EMBODIMENTS

Exemplary embodiments of the present invention will be described more fully with reference to the accompanying drawings.

Figure 1:
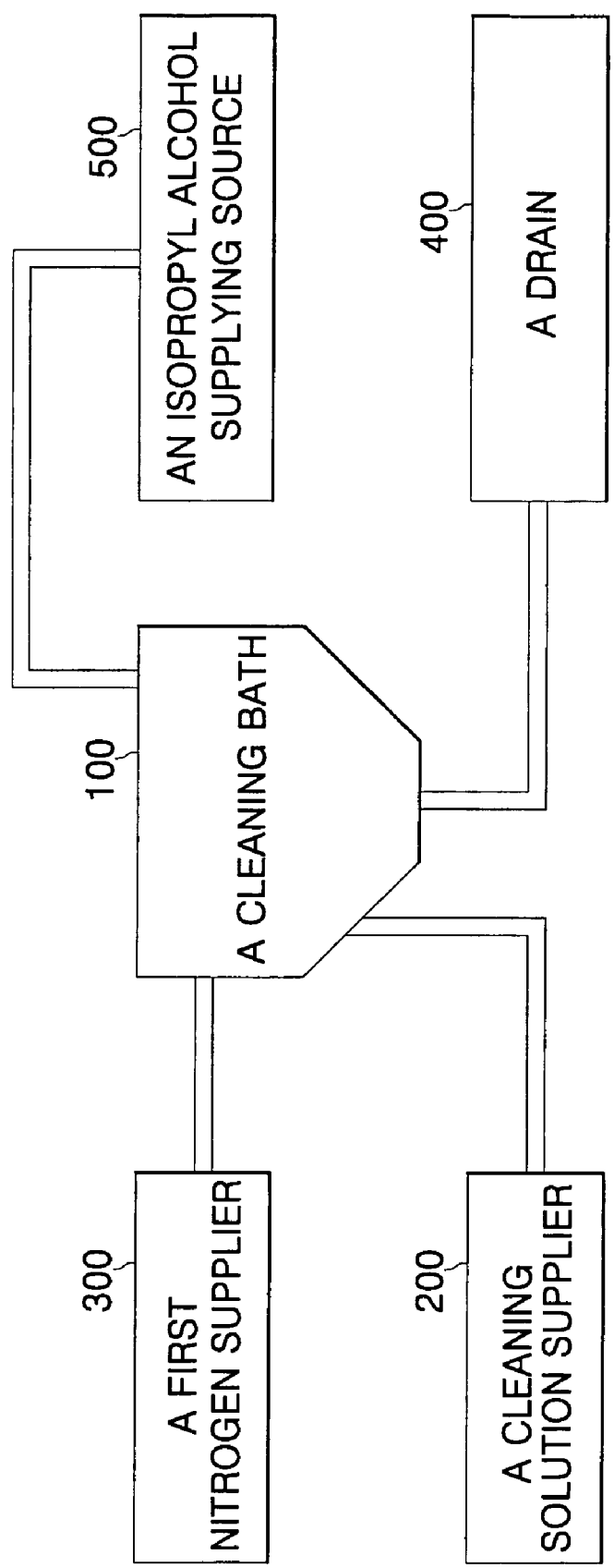
FIG. 1 is a conceptual block diagram illustrating a substrate dryer according to an embodiment of the present invention.
Figure 2:
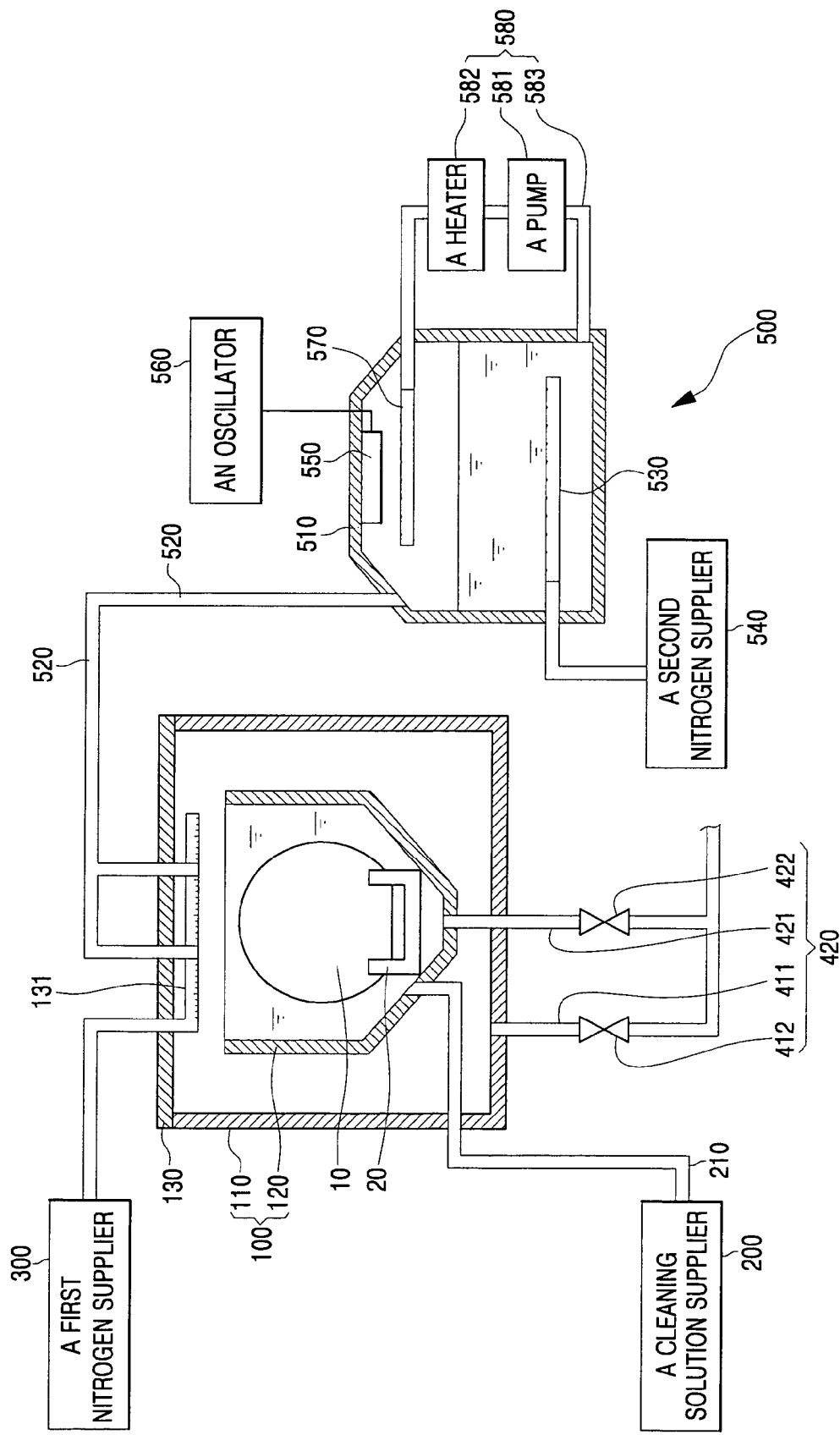
FIG. 2 is a structural diagram illustrating a substrate dryer according to an embodiment of the present invention.

As shown in FIGS. 1 and 2, a substrate dryer comprises a cleaning bath 100 for holding a cleaning solution for cleaning a cleaning target, that is, a substrate 10 such as a wafer. Here, deionized water is used as the cleaning solution.

The cleaning bath 100 is comprises an inner bath 120 for immersing and cleaning the substrate 10 in the cleaning solution, and an outer bath 110 surrounding the inner bath 120. The substrate 10 immersed in the inner bath 120 is mounted on a substrate guide 20 and positioned in the inside of the inner bath 120. More than one substrate 10 may be mounted on the substrate guide.

Upper parts of the inner bath 120 and the outer bath 110 of the cleaning bath 100 are opened, and a cover 130 is installed on the upper part of the outer bath 110. Thus, the outer bath 110 is constructed to surround the whole of the inner bath 120. The outer bath 110 functions to drain cleaning solution overflow when the cleaning solution is oversupplied. To operate this function, a cleaning solution supply pipe 210 is in the lower part of the inner bath 120, while penetrating the outer bath 110. The supply pipe 210 supplies the cleaning solution to the inside of the inner bath 120, and a cleaning solution supplier 200 outside of the baths supplies the cleaning solution to the cleaning solution supply pipe 210.

A drain 400 is provided to the lower part of the cleaning bath 100. The drain 400 comprises an outer bath drain 411 in the bottom of the outer bath 110 to drain any cleaning solution overflow in the outer bath 110 to the outside, and an inner bath drain 421 in the bottom of the inner bath 120 to drain the cleaning solution from the inner bath 120 to the outside. A first drain valve 412 on the outer bath drain 411 controls the flow in the outer bath drain 411. A second drain valve 422 on the inner bath drain 421 controls the flow in the inner bath drain 421. The outer bath drain 411 with the drain valve 412 and the inner bath drain 421 with the drain valve 422 are connected to each other and form a common drain. A special pump (not shown) may be installed in the drains.

A nitrogen supply nozzle 131 is in the cover 130 of the outer bath 110 to supply nitrogen gas to the inside of the inner bath 120. The nitrogen supply nozzle 131 is connected to a first nitrogen supply source 300 that is outside of the cleaning bath 100, and supplies heated nitrogen of a desired temperature to form nitrogen atmosphere in the inner bath 120. Nitrogen is supplied to the inside of the cleaning bath 100 by the first nitrogen supply source 300 to stably perform a drying process stably. The nitrogen is heated in the first nitrogen supply source 300 to be in the range of 100 to 150° C., and the temperature of the inside of the cleaning bath 100 is controlled to be about 80° C.

Separately from the cleaning bath 100, an IPA supplier 500 is provided to supply IPA, a liquid having a lower surface tension than the cleaning solution, to the inside of the cleaning bath 100, for drying the substrate 10. The IPA supplier 500 is connected to the cleaning bath 100 through an IPA supply pipe 520. The IPA supply pipe 520 penetrates the cover 130 and is divided into a plurality of paths, and positioned so that their nozzles open towards the lower part of the inner bath 120. The IPA supplier 500 supplies bubble-state IPA and atomized IPA to the cleaning solution stored in the inner bath 120 to form an IPA layer having a desired thickness on the cleaning solution.

The IPA supplier 500 comprises an IPA supply tank 510. The IPA supply tank 510 is constructed to continuously receive IPA from a separate IPA supply line (not shown).

Figure 3:
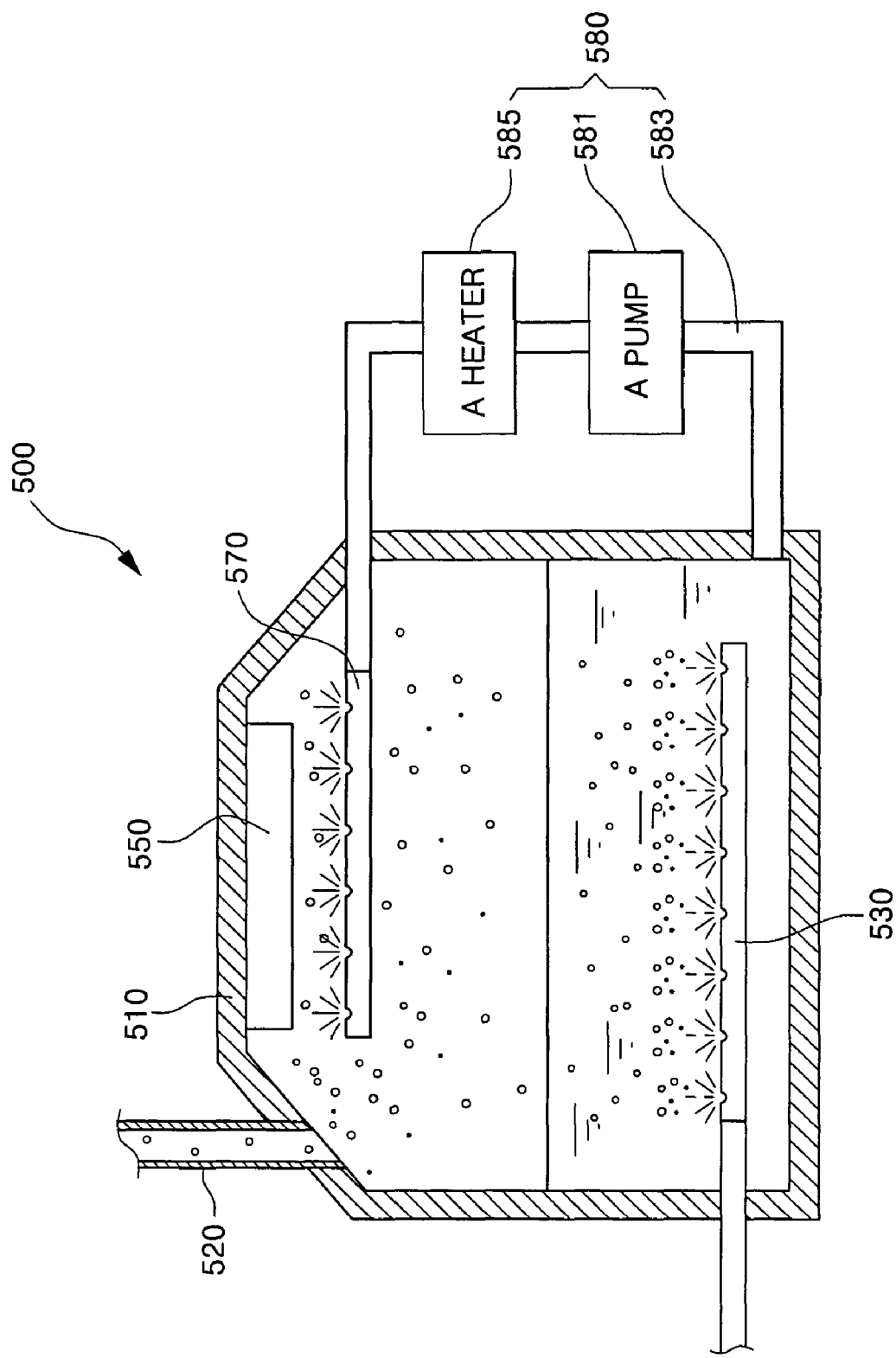
FIG. 3 is an enlarged cross-sectional view illustrating an isopropyl alcohol supplier according to an embodiment of the present invention.

As shown in FIG. 3, in the IPA supply tank 510, a bubble nozzle 530 extends from the exterior to within the IPA in the IPA supply tank 510. The bubble nozzle 530 emits nitrogen supplied from a second nitrogen supply source 540 from within the IPA to form an IPA atmosphere in a bubble-state in the IPA supply tank 510. Besides nitrogen, another inert gas such as argon and helium may be used as a supply gas.

A vibrator 550 is installed in the upper part of the inside of the IPA supply tank 510. The vibrator 550 is connected to an oscillator 560 outside the IPA supply tank 510 to generate ultrasonic oscillations. Below the vibrator 550, a spray nozzle 570 pumps IPA stored in the IPA supply tank 510 and sprays onto the vibrator 550. A pump unit 580 is outside of the IPA supply tank 510 to pump the IPA to the spray nozzle 570.

The pump unit 580 comprises a pump pipe 583 with a lower end that is extended to within the IPA in the lower part of the IPA supply tank 510. A pump 581 is incorporated with the pump pipe 583, as well as a heater 582 for heating the pumped IPA to a desired temperature.

The heater 582 heats the IPA to up to the boiling point of the IPA. As an example, with IPA, because the boiling point is about 83° C. in 1 atm, it is desirable to be in the range of about 25 to 80° C. The IPA is heated to keep an atmosphere of the IPA supplied to the inside of the inner bath 120 and to improve the drying effect of the substrate 10.

The vibrator 550 atomizes the IPA which is sprayed on the vibrator 550 through the IPA spray nozzle 570. The concentration of IPA in the IPA supplier 500 may be raised so that the concentration of the IPA in the inner bath 120 can, in turn, be raised.

The vibration frequency of the vibrator 550 can be controlled as needed. That is, depending on the concentration of IPA being supplied, the vibrator 550 may be turned off or the vibration frequency may be increased or decreased. In the present embodiment, ultrasonic waves of 20 to 400 KHz, megasonic waves of 700 KHz to 1.2 MHz, or any other range may be used as vibration frequency. When the megasonic frequency is used, IPA may be atomized and supplied to have a concentration much higher than if the IPA bubbles were conventionally generated.

At this point it is useful to look into the interrelation between the concentration of the IPA and the ultrasonic waves. As known conventionally, for a frequency of 1 MHz, the amount of atomization indicates a particle acceleration of about 1,000,000 G (9.8 m/sec$^2$). Therefore, due to atomization, according to a Newton's law of motion (F=ma, where m is the particle mass of the IPA, and a is the particle acceleration of the IPA), it is possible to provide an IPA having a concentration much higher than that of a conventional case of simple bubbles.

However, the concentration of the IPA has to be controlled to be in a proper range. That is, when the concentration is relatively low, for the case of a highly-integrated semiconductor device, effective drying is not obtained. But when the concentration is much higher, the number of IPA particles left on the substrate 10 after a drying process is increased, so that poor cleaning may occur. Thus, it is desirable to have, for example, a concentration of IPA that is in the range of 0.2 to 5.0%, so the thickness of the IPA formed on the cleaning solution is in the range of 1 to 3 mm.

Besides the IPA, ethyl alcohol, methyl alcohol, tetrahydrofuran, acetone, perfluoro hexane, hexane, and ether may be employed and used in the IPA supplier 500.

Hereinafter, the operation of the substrate dryer according to the present embodiment described above will be explained.

Figure 4:
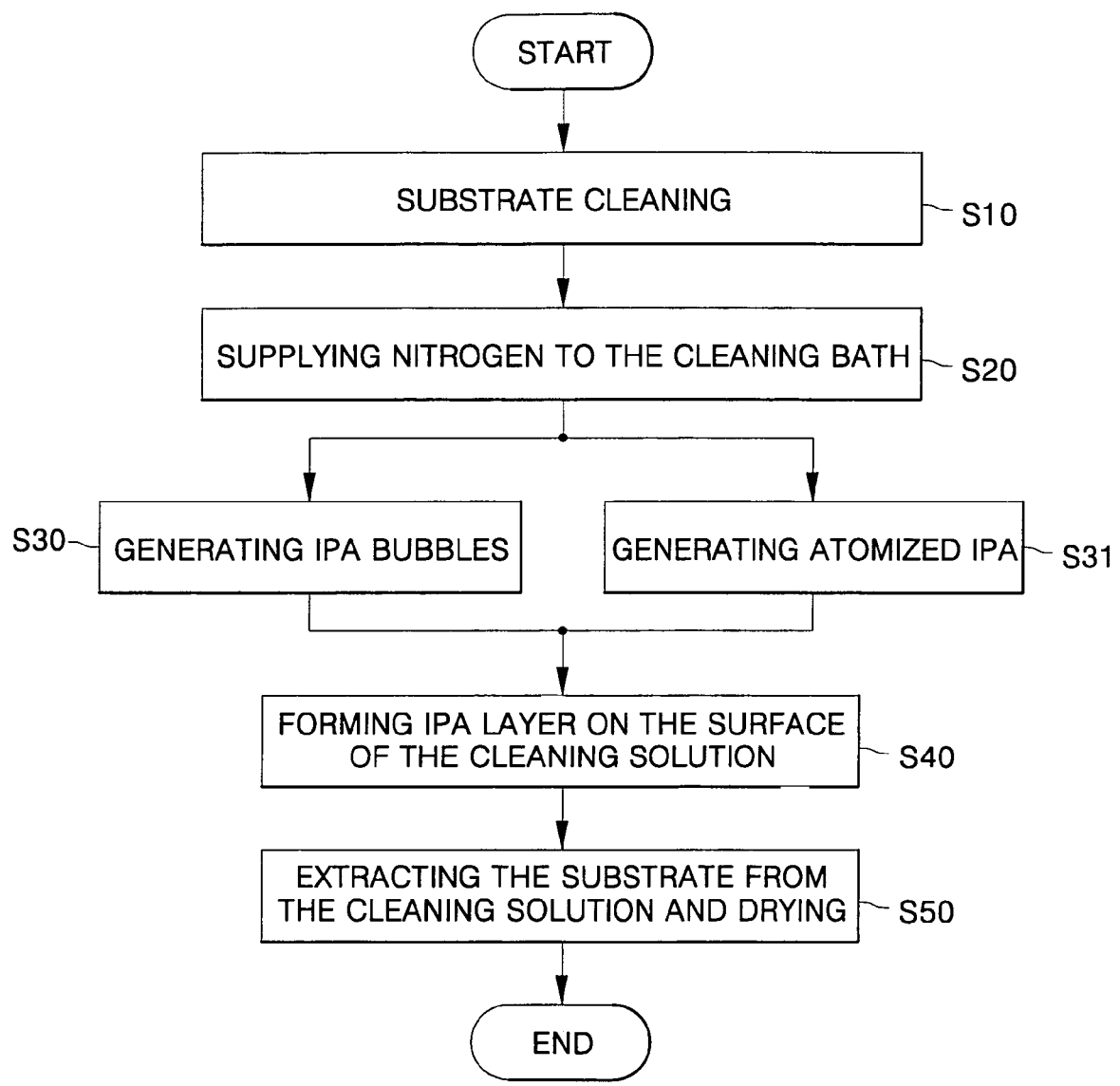
FIG. 4 is a flowchart illustrating operations of a substrate dryer according to an embodiment of the present invention.

As shown in FIG. 4, in a substrate dryer according to the present embodiment, when a substrate guide 20, on which a substrate 10 is mounted, is positioned in the inner bath 120, a cleaning solution is supplied through a cleaning solution supply pipe 210, and then a cleaning process starts. The cleaning solution is supplied from the lower part of the inner bath 120 until it overflows the top of the inner bath 120. Any cleaning solution overflow is collected in the lower part of the outer bath 110. At the same time, when the first drain valve 412 is opened, the cleaning solution is drained from the lower part of the outer bath 110 through the outer bath drain 411 (S10).

If the cleaning process is completed, a substrate drying process starts. After the cleaning process, the atmosphere of the inside of the outer bath 110 is converted into a drying atmosphere by supplying heated nitrogen gas to the inside of the outer bath 110 through a nitrogen supply nozzle to form nitrogen atmosphere in the outer bath 110. At this point, the nitrogen atmosphere is kept at about 80° C. and in the range of 2 to 4 kg/cm$^3$ (S20).

Then, a portion of the cleaning solution in the inner bath 120 is drained through the inner bath drain 421 to a level above where the substrate is not exposed over the cleaning solution. And then the IPA is supplied from the IPA supplier 500 through the IPA supply pipe 520.

In supplying the IPA, bubble-state IPA and atomized IPA are supplied selectively or together (S30) (S31). For example, at first only bubble-state IPA may be supplied. Then when the surface of the cleaning solution drops to under the half height of the substrate 10, atomized IPA may be supplied together with the bubble-state IPA. That is, the substrate 10 is dried efficiently by raising the concentration of IPA gradually.

But, using another method, bubble-state IPA and atomized IPA may be supplied together from the beginning. Depending on the type of substrate 10, semiconductor device, or integration degree and type of display substrate, the concentration of IPA can be controlled to be various levels.

For the bubble-state IPA, when nitrogen is supplied from a second nitrogen supplier 540 to the inside of the IPA supplier 500 through a bubble nozzle 530, bubbles are generated in the IPA, and then the IPA supply tank 510 fills with these bubbles. These bubbles are discharged to the inside of the cleaning bath 100 through the IPA supply pipe 520 (S30).

For the atomized IPA, IPA is pumped by the pump 581 in the IPA pump 580, heated by heater 582, and sprayed on the vibrator 550 through the spray nozzle 570. Then, the vibrator 550 atomizes the sprayed IPA and the IPA supply tank 510 is filled with the atomized IPA. As a result, the bubble-state IPA and the atomized IPA together fill the IPA supply tank 510 and this combination is supplied to the inside of the cleaning bath 100 through the IPA supply pipe (S31).

IPA supplied to the cleaning bath 100 overflows the upper part of the inner bath 120 and forms an IPA layer of a desired thickness on the cleaning solution (S40). Meanwhile a portion of this IPA layer vaporizes. The vaporized IPA is included in the nitrogen atmosphere, so a mixed atmosphere of IPA and nitrogen gas is formed in the upper part of the inner bath 120.

Next, a drying process is started by draining the cleaning solution through the inner bath drain 421 of the inner bath 120 (S50). At this point, the cleaning solution is drained through the inner bath drain 421 at a constant rate. In another embodiment, the pump 581 may be used for draining the cleaning solution described above.

However, if the cleaning solution is drained too rapidly, the IPA layer may be lost, and a sufficient Marangoni effect will not be obtained. On the other hand, much slower draining will decrease process efficiency. Thus, in a preferred embodiment, the level of the cleaning solution falls at the rate of from about 1.5 to about 2.5 mm/sec.

The thickness of the IPA layer should be kept constant or increased, so water residue on the substrate 10 is removed by the Marangoni effect. Simply explained, as the substrate is extracted from the cleaning solution (e.g. the cleaning solution is slowly drained, or in another embodiment, the substrate is slowly lifted out of the cleaning solution), the residue on the surface falls off. This extraction of the substrate causes the surface of the cleaning solution to pass across the surface of the substrate to be dried, e.g. a substantial portion or the entire substrate. Then, due to surface tension, at the surface level of the cleaning solution and the IPA layer, these two solutions closely adhere to the substrate 10. But, at this point, because the IPA has a smaller surface tension than the cleaning solution, when the water level is falling off, liquid flows rapidly from the IPA layer with a small surface tension, to the cleaning solution with a large surface tension. Thus, water left on the substrate 10 is removed, so that the substrate 10 is dried.

As described above, if the concentration of IPA is kept constant or increased, it is possible to completely remove water on a semiconductor device, even having a complicated three-dimensional structure, a circuit pattern having a large step-difference, or a substrate where a hydrophobic membrane and a hydrophilic membrane exist together.

On the other hand, it may be desirable that the IPA is supplied on the cleaning solution in the inner bath 120 continuously while the cleaning solution is drained. By supplying the IPA vapor continuously to keep the mixed atmosphere of the IPA and nitrogen gas, the IPA layer on the cleaning solution is maintained at a constant amount while the cleaning solution is drained, so that the drying effect may even be improved.

When the water level of the cleaning solution is below the wafer, the supply of IPA is stopped. The supply of heated nitrogen gas is also stopped. Then, after the cleaning solution left under the substrate 10 is completely drained through the drain 421, the cover 130 is opened and the substrate guide 20 on which the substrate is mounted is extracted from the cleaning bath 100. Cleaning and drying of the substrate 10 is then complete.

Besides embodiments described above, other embodiments may be executed by changing various elements. That is, process conditions may be changed, a portion of the construction may be modified, a vibrator may be installed to the lower part or side of a supply tank, or vibrator may be installed on the supply tank without installing a spray nozzle to the supply tank.

In a substrate dryer, according to the embodiment of the present invention described above, IPA bubbles using nitrogen and atomized IPA, using ultrasonic frequencies, may be supplied together while keeping the amount of the nitrogen and nitrogen supply pressure constant. This may generate IPA bubbles in the IPA Marangoni drying method, so that the concentration of IPA is raised above conventional amounts to improve drying efficiency. Further, in the case of semiconductor devices, manufacturing efficiency of a substrate is improved by effectively drying the substrate which may have a complicated three-dimensional structure, a hydrophobic membrane and a hydrophilic membrane together, or a pattern with a large step-difference.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A method of cleaning and drying a substrate, the method comprising:
    immersing the substrate into a cleaning solution in a cleaning bath vessel;
    cleaning the substrate in the cleaning solution;
    extracting the substrate from the cleaning solution; and
    drying the substrate by producing atomized isopropyl alcohol (IPA) and bubbles of IPA, and supplying the bubbles of IPA, the atomized IPA and one batch of nitrogen gas into the cleaning bath vessel,
    wherein the producing of the atomized IPA and the bubbles of IPA comprises:
    supplying another batch of nitrogen gas directly into a body of liquid isopropyl alcohol (IPA) contained in an isopropyl alcohol supply unit, disposed outside the cleaning bath vessel, to thereby produce bubbles of IPA in the isopropyl alcohol supply unit,
    heating liquid IPA in the isopropyl alcohol supply unit, and
    spraying the heated liquid IPA directly onto a vibrator of the isopropyl alcohol supply unit to thereby atomize the IPA.

2. The method according to claim 1, wherein the one batch of nitrogen gas is supplied into the cleaning bath vessel while the temperature inside the cleaning bath vessel is maintained at about 80° C.

3. The method according to claim 2, wherein the supplying of the one batch of nitrogen gas into the cleaning bath vessel comprises supplying nitrogen gas heated to a temperature of at least 100° C. into the cleaning bath vessel.

4. The method according to claim 1, wherein the atomizing of the IPA comprises spraying the IPA onto the vibrator while the vibrator is vibrating at frequency in a range of 20 KHz to 1.2 MHz.

5. The method according to claim 1, wherein the concentration of the atomized IPA supplied into the cleaning bath vessel is in the range of 0.2 to 5.0%.

6. A method of generating atomized isopropyl (IPA) for use in a process of drying a substrate, the method comprising:
    producing bubbles of isopropyl alcohol by supplying nitrogen gas directly into a body of liquid isopropyl alcohol contained in a tank of an isopropyl alcohol supply unit,
    heating another portion of the body of liquid isopropyl alcohol using a heater of the isopropyl alcohol supply unit, and
    spraying the heated portion of the liquid isopropyl alcohol directly onto a vibrator in the tank of the isopropyl alcohol supply unit to thereby atomize said heated portion of the liquid isopropyl alcohol.

7. The method according to claim 6, wherein the atomizing of the liquid isopropyl alcohol comprises spraying the heated portion of the liquid isopropyl alcohol onto the vibrator while the vibrator is vibrating at frequency in a range of 20 KHz to 1.2 MHz.

8. The method according to claim 1, wherein nitrogen gas constituting said one batch is introduced into the cleaning bath vessel before the substrate is extracted from the cleaning solution, and before the atomized IPA and the bubbles of IPA are supplied into the cleaning bath vessel.

9. A method of cleaning and drying a substrate, the method comprising:
    providing a vessel having an outer overflow bath and an inner bath within the outer bath;
    immersing the substrate in cleaning solution in the inner bath;
    cleaning the substrate in the cleaning solution;
    supplying nitrogen gas into the outer bath to form an atmosphere of nitrogen in the outer bath;
    draining cleaning solution from the inner bath after the atmosphere of nitrogen has been formed in the outer bath to extract thereby extract the substrate from the cleaning solution by; and
    drying the substrate including by producing atomized isopropyl alcohol (IPA) and bubbles of IPA outside the vessel, and subsequently supplying the atomized IPA and the bubbles of IPA into the vessel,
    wherein the producing of the atomized IPA comprises heating liquid IPA and spraying the heated IPA directly onto a vibrator at a location outside the vessel, and
    wherein the supplying of the atomized IPA and the bubbles of IPA into the vessel comprises directing the atomized IPA and the bubbles of IPA towards the inner bath.

10. The method according to claim 9, wherein IPA is supplied onto the surface of the cleaning solution before the substrate is exposed by the draining of the cleaning solution from the inner bath.

11. The method according to claim 9, wherein the bubbles of IPA are supplied into the vessel before the atomized IPA is supplied into the vessel.

12. The method according to claim 9, wherein the bubbles of IPA are supplied into the vessel as the cleaning solution as the substrate is being exposed by the draining of the cleaning solution from the inner bath and, and the atomized IPA is supplied into the vessel only after a portion of the substrate has been exposed so as to raise the concentration of IPA in the vessel.

13. The method according to claim 9, wherein the bubbles of IPA and the atomized IPA are supplied at the same time into the vessel.

14. The method according to claim 9, wherein the nitrogen gas is heated before it is supplied into the outer bath.

15. The method according to claim 9, wherein the producing of the bubbles of IPA comprises supplying nitrogen gas through a body of liquid IPA at a location outside the vessel.

* * * * *